United States Patent
Lim et al.

(10) Patent No.: US 11,773,210 B2
(45) Date of Patent: Oct. 3, 2023

(54) COPOLYMER AND ORGANIC SOLAR CELL COMPRISING SAME

(71) Applicants: LG CHEM, LTD., Seoul (KR); DAEGU GYEONGBUK INSTITUTE OF SCIENCE AND TECHNOLOGY, Daegu (KR)

(72) Inventors: Bogyu Lim, Daejeon (KR); Youngu Lee, Daegu (KR); Jiyoung Lee, Daejeon (KR); Honggi Kim, Daegu (KR); Hyojung Heo, Daegu (KR); Jaechol Lee, Daejeon (KR)

(73) Assignees: LG CHEM, LTD., Seoul (KR); DAEGU GYEONGBUK INSTITUTE OF SCIENCE AND TECHNOLOGY, Daegu (KR)

( * ) Notice: Subject to any disclaimer, the term of this patent is extended or adjusted under 35 U.S.C. 154(b) by 311 days.

(21) Appl. No.: 16/070,314

(22) PCT Filed: Jan. 16, 2017

(86) PCT No.: PCT/KR2017/000523
§ 371 (c)(1),
(2) Date: Jul. 16, 2018

(87) PCT Pub. No.: WO2017/131376
PCT Pub. Date: Aug. 3, 2017

(65) Prior Publication Data
US 2019/0023835 A1    Jan. 24, 2019

(30) Foreign Application Priority Data
Jan. 27, 2016 (KR) .................. 10-2016-0009957

(51) Int. Cl.
C08L 65/00 (2006.01)
H01L 31/0256 (2006.01)
(Continued)

(52) U.S. Cl.
CPC .......... C08G 61/126 (2013.01); C08G 61/12 (2013.01); C08L 65/00 (2013.01);
(Continued)

(58) Field of Classification Search
CPC . H01L 51/00; H01L 51/0036; H01L 51/0043; H01L 51/0068; H01L 51/0074;
(Continued)

(56) References Cited

U.S. PATENT DOCUMENTS

2014/0225091 A1* 8/2014 O'Carroll ........... H01L 51/5225
257/40
2015/0221793 A1* 8/2015 Okubo ................ H01L 31/0749
136/256
(Continued)

FOREIGN PATENT DOCUMENTS

CN    103833991 A    6/2014
JP    2014079939 A    5/2014
(Continued)

OTHER PUBLICATIONS

Ye et al, Highly efficient 2D-conjugated benzodithiophene-based photovoltaic polymer with linear alkylthio side chain,2014.*
(Continued)

*Primary Examiner* — Dustin Q Dam
(74) *Attorney, Agent, or Firm* — Myers Bigel, P.A.

(57) ABSTRACT

The present specification relates to a copolymer including a first unit represented by Chemical Formula 1; and a second unit represented by Chemical Formula 2, and an organic solar cell including the same.

15 Claims, 9 Drawing Sheets

(51) Int. Cl.
  *H10K 30/30*    (2023.01)
  *H10K 30/80*    (2023.01)
  *C08G 61/12*    (2006.01)
  *H10K 30/00*    (2023.01)
  *H10K 85/10*    (2023.01)
  *H10K 85/60*    (2023.01)
  *H10K 99/00*    (2023.01)

(52) U.S. Cl.
  CPC ......... *H01L 31/0256* (2013.01); *H10K 30/00* (2023.02); *H10K 30/30* (2023.02); *H10K 30/80* (2023.02); *H10K 85/113* (2023.02); *H10K 85/151* (2023.02); *H10K 85/655* (2023.02); *H10K 85/6576* (2023.02); *H10K 99/00* (2023.02); *C08G 2261/91* (2013.01); *C08L 2203/204* (2013.01); *Y02E 10/549* (2013.01); *Y02P 70/50* (2015.11)

(58) Field of Classification Search
  CPC ..... H01L 51/42; H01L 51/4253; H01L 51/44; H01L 31/0256; C08G 65/00; C08G 61/126; C08G 61/12; C08G 2261/91; C08L 65/00; C08L 2203/204; H10K 30/30; H10K 30/80; H10K 85/655; H10K 85/6576
  See application file for complete search history.

(56) References Cited

U.S. PATENT DOCUMENTS

| | | | | |
|---|---|---|---|---|
| 2016/0204349 | A1* | 7/2016 | Kim | C08G 61/124 |
| | | | | 136/263 |
| 2017/0062745 | A1 | 3/2017 | Lee et al. | |
| 2018/0166633 | A1* | 6/2018 | Cho | C08G 61/123 |

FOREIGN PATENT DOCUMENTS

| | | | |
|---|---|---|---|
| KR | 20150124913 A | 11/2015 | |
| WO | WO-2015147598 A1 * | 10/2015 | ........... C07D 495/04 |

OTHER PUBLICATIONS

Zhang et al, Realizing over 10% efficiency in polymer solar cell device optimization, 2015.*
Cui, Chaohua, et al.; Improvement of open-circuit voltage and photovoltaic properties of 2D-conjugated polymers by alkylthio substitution; Energy Environ. Sci., 2014, 7, 2276 (Year: 2014).*
English Language translation of the International Search Report of the International Searching Authority corresponding to International Patent Application No. PCT/KR2017/000523 dated Apr. 26, 2017. (2 pages).
Tang et al. "Two-layer organic photovoltaic cell" Applied Physics Letters 48(2):183-185 (Jan. 13, 1986).
Yao et al. "PBDT-TSR: a highly efficient conjugated polymer for polymer solar cells with regioregular structure" Journal of Materials Chemistry A 4(5):1708-1713 (2016).
Yu et al. "Polymer Photovoltaic Cells: Enhanced Efficiencies via a Network of Internal Donor-Acceptor Heterojunctions" Science 270:1789-1791 (Dec. 15, 1995).
Zhong et al. "Influence of Regio- and Chemoselectivity on teh Properties of Fluoro-substituted Thienthiophene and Benzodithiophene Copolymers" Journal of the American Chemical Society 137(24):7616-7619 (May 29, 2015).
Extended European Search Report Corresponding to European Patent Application No. 17744498.1 dated Nov. 30, 2018. (5 pages).
Cui et al. "Improvement of open-circuit voltage and photovoltaic properties of 2D-conjugated polymers by alkylthio substitution" Energy & Environmental Science 7(7):2276-2284 (Jan. 1, 2014).
Huang et al. "Benzodifuran and benzodithiophene donor-acceptor polymers for bulk heterojunction solar cells" Journal of Materials Chemistry A 3(13):6980-6989 (Jan. 1, 2015).
Cui et al. "High-performance polymer solar cells based on a 2D-conjugated polymer with an alkylthio side-chain" Energy & Environmental Science 9(3):885-891 (Jan. 1, 2016).

* cited by examiner

[FIG. 1]
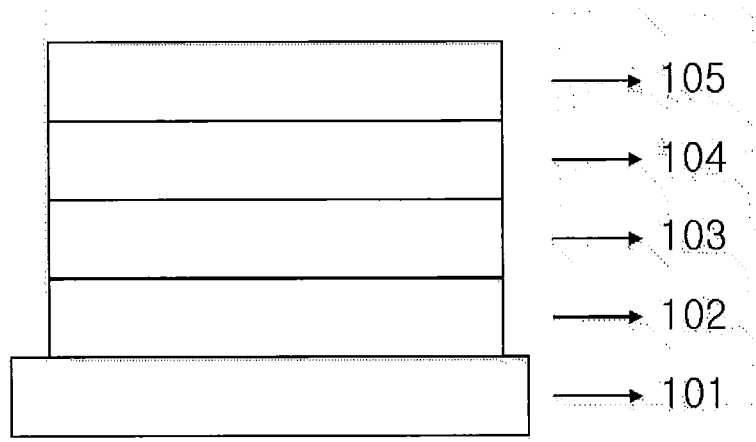
[FIG. 2]
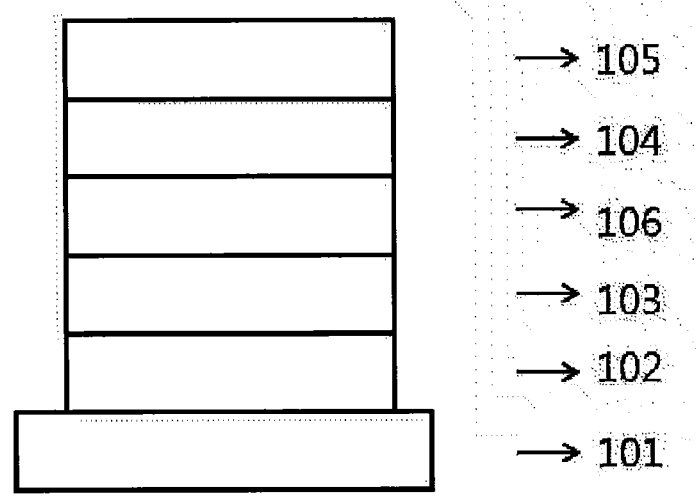

[FIG. 3]
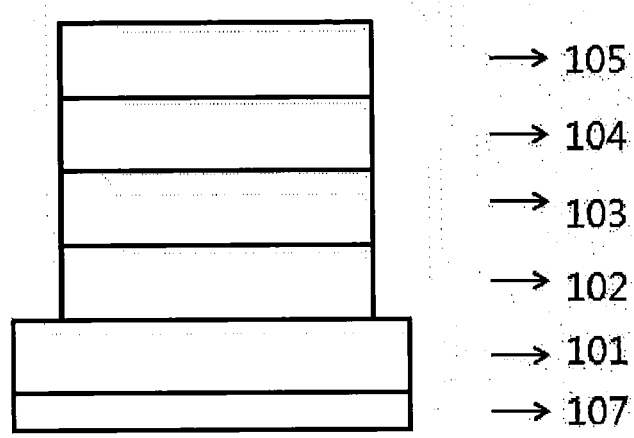
→ 105
→ 104
→ 103
→ 102
→ 101
→ 107
[FIG. 4]
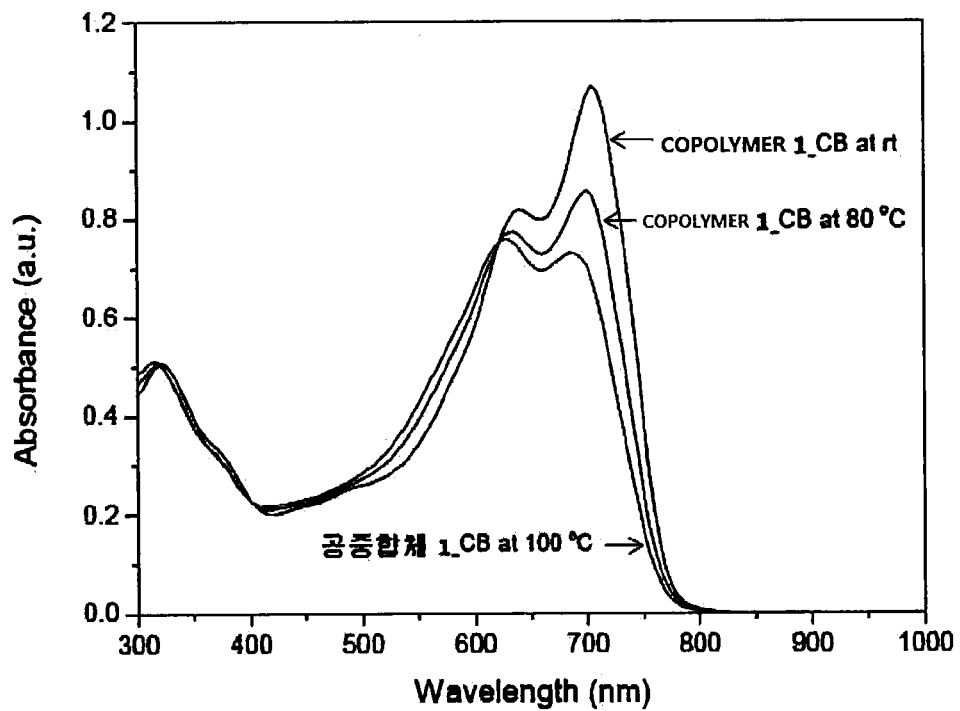

[FIG. 5]
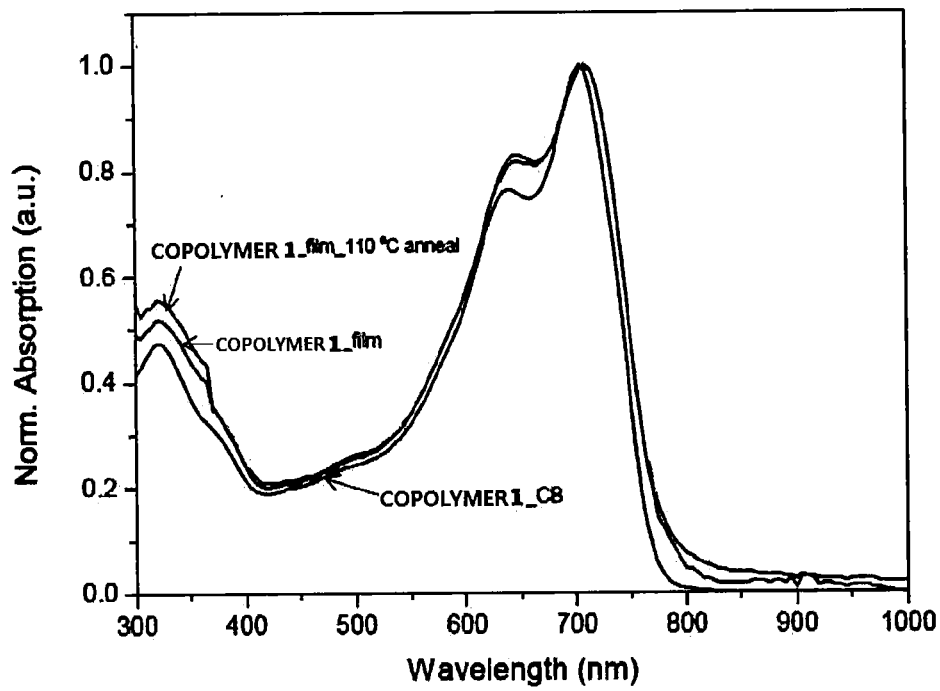
[FIG. 6]
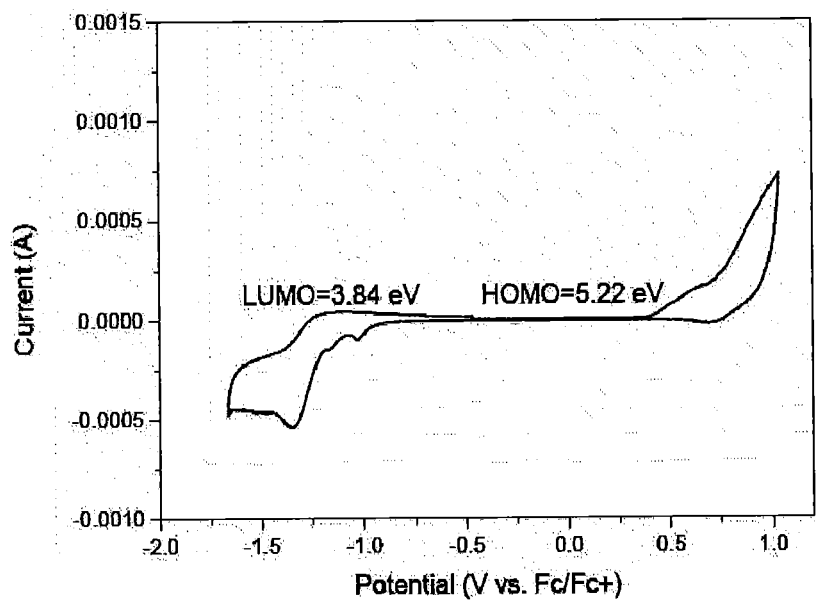

[FIG. 7]
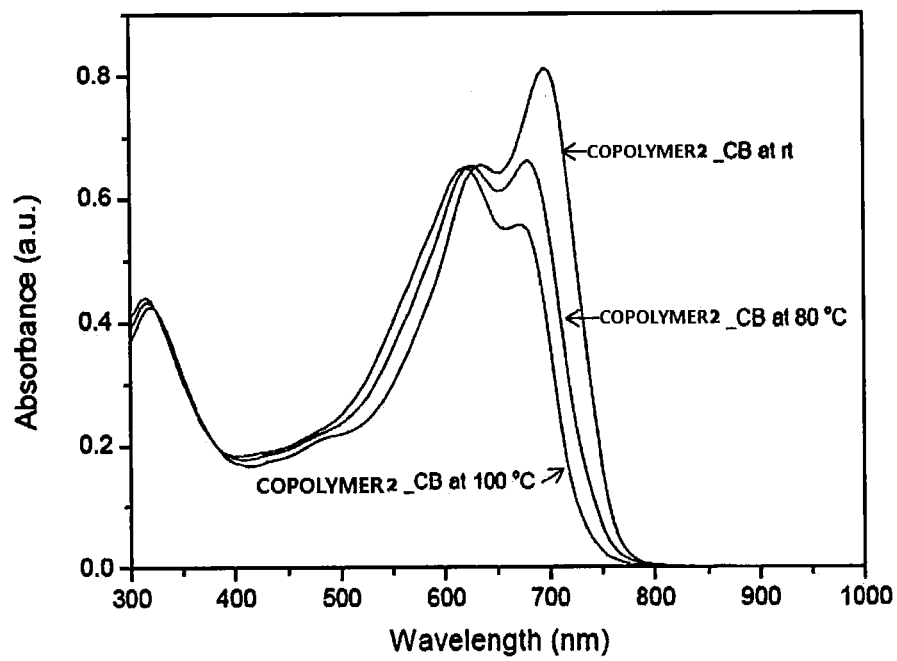

[FIG. 8]
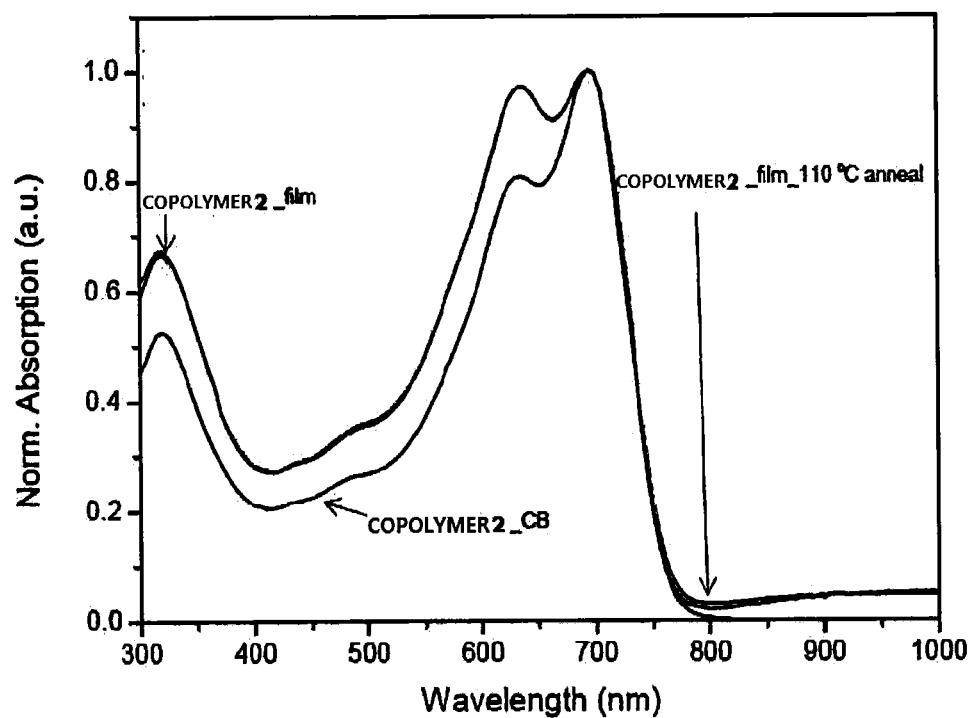

[FIG. 9]
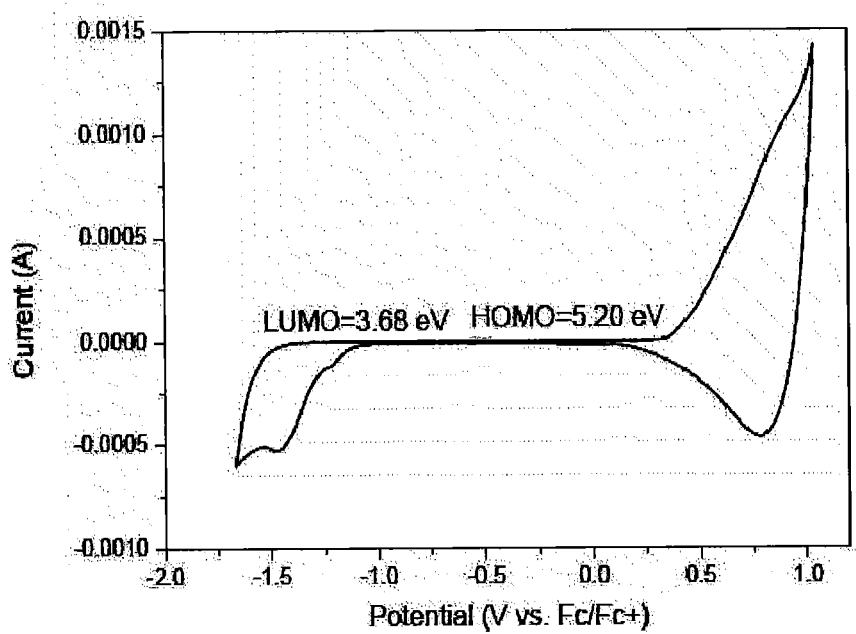
[FIG. 10]
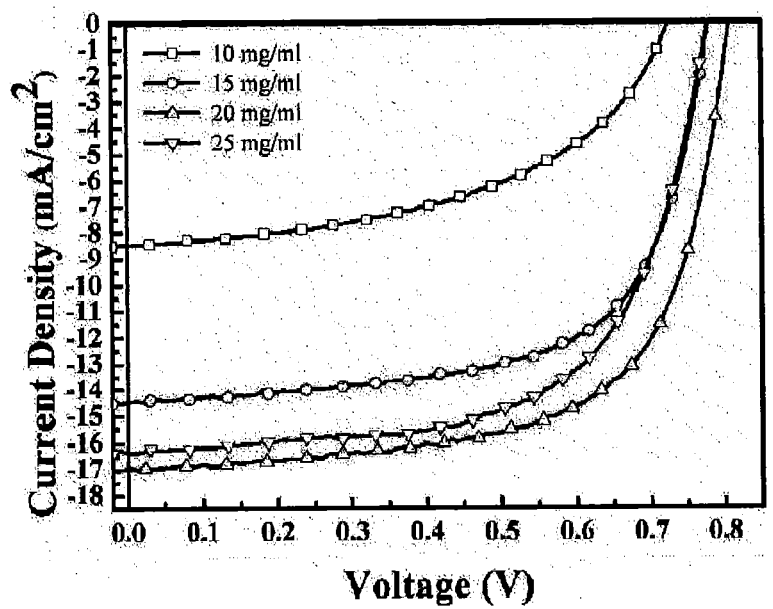

[FIG. 11]
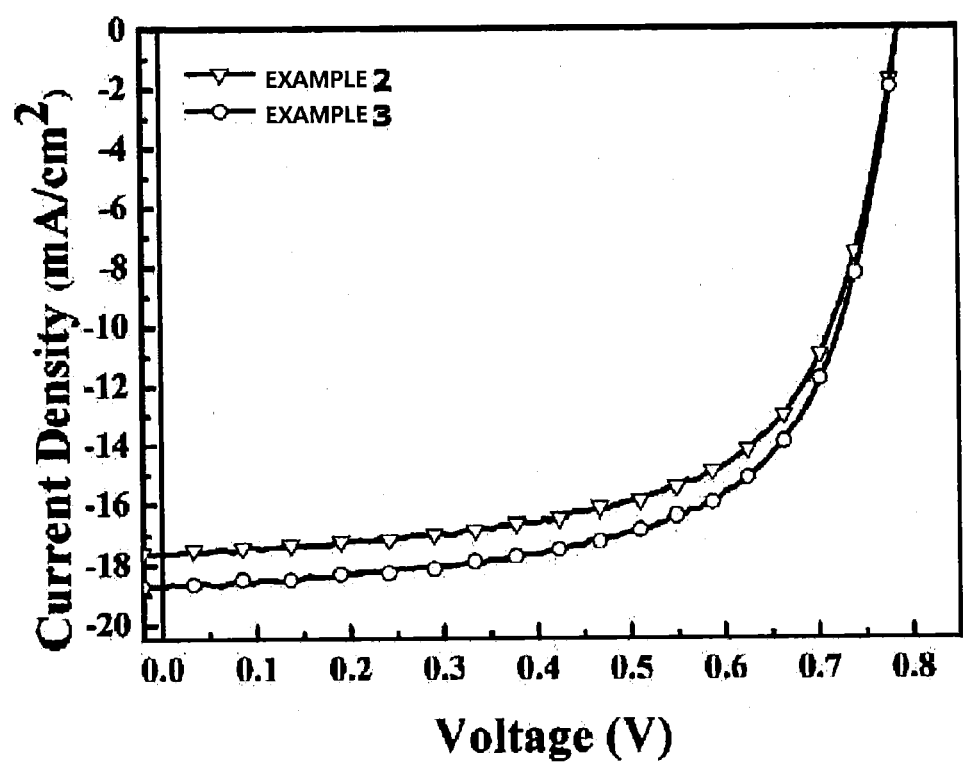

[FIG. 12]
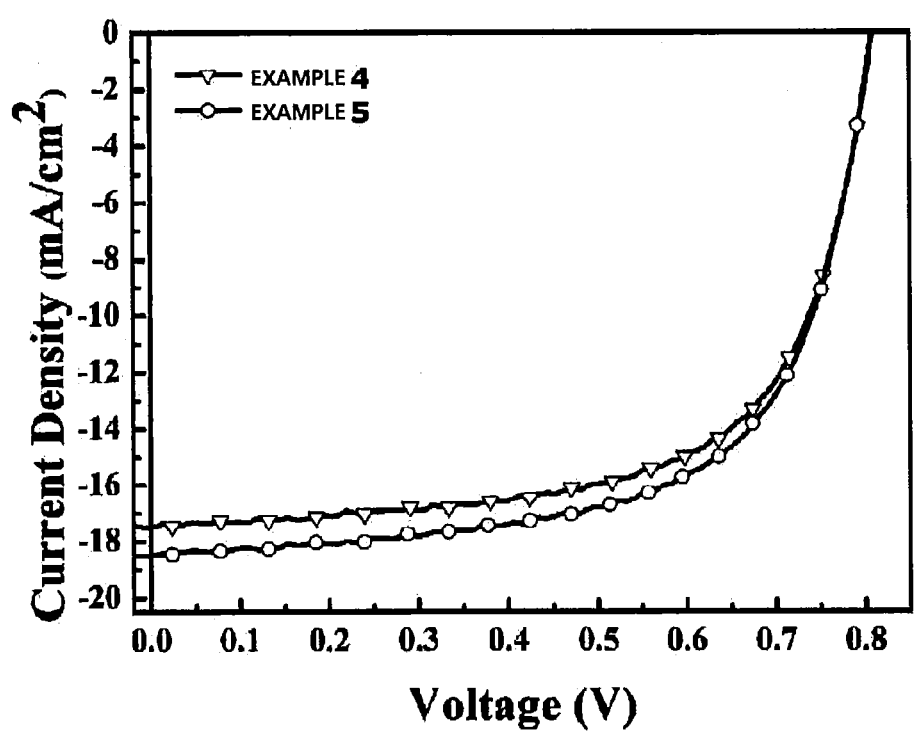

[FIG. 13]
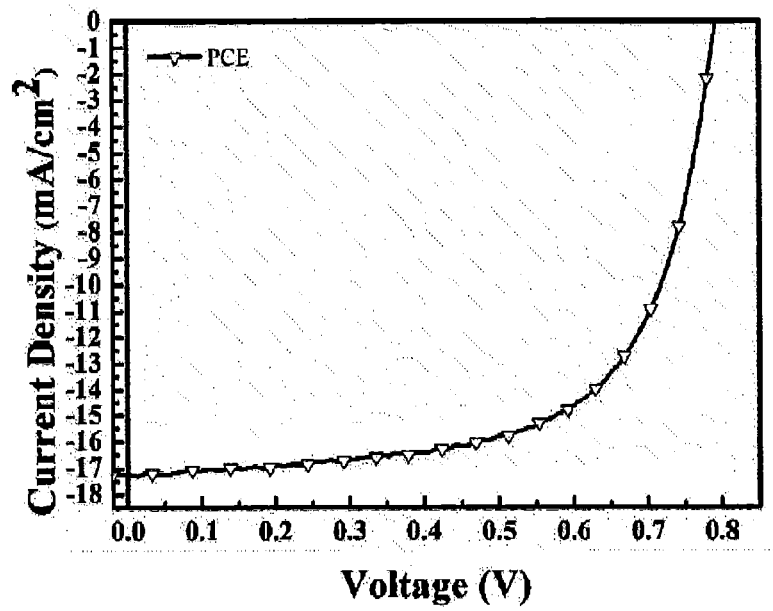
[FIG. 14]
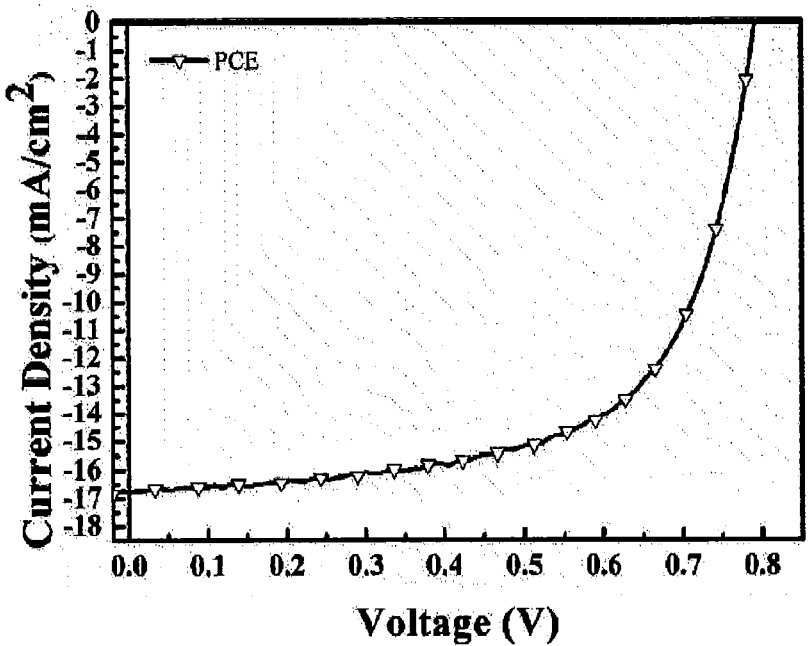

COPOLYMER AND ORGANIC SOLAR CELL COMPRISING SAME

CROSS REFERENCE TO RELATED APPLICATIONS

This application is a 35 U.S.C. § 371 national stage application of PCT International Application No. PCT/KR2017/000523, filed on Jan. 16 2017, which claims priority from Korean Patent Application No. 10-2016-0009957, filed on Jan. 27, 2016, the contents of which are incorporated herein by reference in their entireties. The above-referenced PCT International Application was published in the Korean language as International Publication No. WO 2017/131376 A1 on Aug. 3, 2017.

TECHNICAL FIELD

The present specification claims priority to and the benefits of Korean Patent Application No. 10-2016-0009957, filed with the Korean Intellectual Property Office on Jan. 27, 2016, the entire contents of which are incorporated herein by reference.

The present specification relates to a copolymer and an organic solar cell including the same.

BACKGROUND ART

An organic solar cell is a device capable of directly converting solar energy to electric energy by applying a photovoltaic effect. Solar cells are divided into inorganic solar cells and organic solar cells depending on the materials forming a thin film. Typical solar cells are fabricated using a p-n junction by doping crystalline silicon (Si), an inorganic semiconductor. Electrons and holes generated by light absorption spread to p-n junction points, are accelerated by the electric field, and migrate to an electrode. Power conversion efficiency of this process is defined as a ratio of power given to an external circuit and solar power put into a solar cell, and the ratio has been accomplished up to 24% when measured under a currently standardized hypothetical solar irradiation condition. However, existing inorganic solar cells already have limits in economic feasibility and material supplies, and therefore, organic material semiconductor solar cells that are readily processed, inexpensive and have various functions have been highly favored as a long-term alternative energy source.

For solar cells, it is important to increase efficiency so as to output as much electric energy as possible from solar energy. In order to improve efficiency of such solar cells, generating as much excitons as possible inside a semiconductor is important, however, taking the generated charges outside without loss is also important. One of the reasons for the charge loss is the dissipation of the generated electrons and holes by recombination. Various methods for delivering the generated electrons or holes to an electrode without loss have been proposed, however, most of the methods require additional processes, and accordingly, the fabricating costs may increase.

DISCLOSURE

Technical Problem

The present specification is directed to providing a copolymer and an organic solar cell including the same.

Technical Solution

One embodiment of the present specification provides a copolymer including a first unit represented by the following Chemical Formula 1; and a second unit represented by the following Chemical Formula 2.

[Chemical Formula 1]

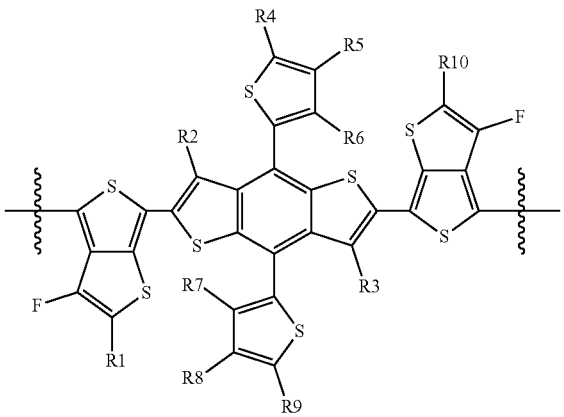

[Chemical Formula 2]

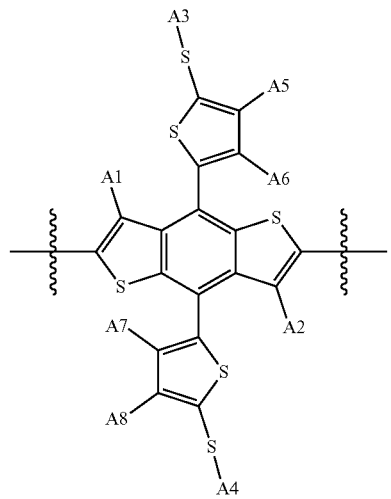

In Chemical Formulae 1 and 2,

R1 to R10 and A1 to A8 are the same as or different from each other, and each independently hydrogen; deuterium; a halogen group; a substituted or unsubstituted alkyl group; a substituted or unsubstituted cycloalkyl group; a substituted or unsubstituted alkoxy group; a substituted or unsubstituted alkenyl group; a substituted or unsubstituted ester group; a substituted or unsubstituted amine group; a substituted or unsubstituted aryl group; or a substituted or unsubstituted heterocyclic group.

Another embodiment of the present specification provides an organic solar cell including a first electrode; a second electrode provided opposite to the first electrode; and one or more organic material layers provided between the first electrode and the second electrode and including a photoactive layer, wherein one or more layers of the organic material layers include the copolymer described above.

Lastly, still another embodiment of the present specification provides a method for manufacturing an organic solar cell including preparing a substrate; forming a first electrode on one region of the substrate; forming an organic material layer including a photoactive layer on a top of the first electrode; and forming a second electrode on the organic material layer, wherein the photoactive layer includes the copolymer described above.

Advantageous Effects

A copolymer according to one embodiment of the present specification has regio-selectivity with fluorine of a first unit represented by Chemical Formula 1 substituting at a specific position. The copolymer having regio-selectivity according to one embodiment of the present specification has relatively excellent crystallinity and an enhanced packing property.

In addition, the copolymer according to one embodiment of the present specification includes a first unit represented by Chemical Formula 1 in which a linked position is selected, and therefore, has regio-regularity that a position linked in the copolymer with two units is selected. The copolymer having regio-regularity according to one embodiment of the present specification has relatively excellent crystallinity.

The copolymer according to one embodiment of the present specification can induce high electron density and/or stabilization of the resonance structure in a device by including a structure in which two thiophene groups are fused.

Additionally, the copolymer according to one embodiment of the present specification can be processed in a non-halogen solvent and therefore, an environmental-friendly organic solar cell can be manufactured.

The copolymer according to one embodiment of the present specification can be used as a material of an organic material layer of an organic solar cell, and an organic solar cell including the same is capable of exhibiting excellent properties in increasing an open circuit voltage and a short circuit current, increasing efficiency and/or the like.

The copolymer according to one embodiment of the present specification can be used either alone or as a mixture with other materials in an organic solar cell, and enhancement in the efficiency, enhancement in the device life time caused by properties such as thermal stability of the compound, and the like, can be expected.

DESCRIPTION OF DRAWINGS

FIGS. 1 to 3 are diagrams illustrating an organic solar cell according to one embodiment of the present specification.

FIG. 4 is a diagram presenting UV-vis absorption spectra of copolymer 1 at room temperature, 80° C. and 100° C. while being dissolved in chlorobenzene.

FIG. 5 is a diagram presenting UV-vis absorption spectra of copolymer 1 in a solution state dissolved in chlorobenzene, in a film state, and after heat treatment at 110° C. in a film state.

FIG. 6 is a diagram presenting an electrochemical measurement result (cyclic voltammetry) of copolymer 1.

FIG. 7 is a diagram presenting UV-vis absorption spectra of copolymer 2 at room temperature, 80° C. and 100° C. while being dissolved in chlorobenzene.

FIG. 8 is a diagram presenting UV-vis absorption spectra of copolymer 2 in a solution state dissolved in chlorobenzene, in a film state, and after heat treatment at 110° C. in a film state.

FIG. 9 is a diagram presenting an electrochemical measurement result (cyclic voltammetry) of copolymer 2.

FIG. 10 is a diagram presenting voltage-dependent current density of organic solar cells according to Examples 1-1 to 1-4.

FIG. 11 is a diagram presenting voltage-dependent current density of organic solar cells according to Examples 2 and 3.

FIG. 12 is a diagram presenting voltage-dependent current density of organic solar cells according to Examples 4 and 5.

FIG. 13 is a diagram presenting voltage-dependent current density of an organic solar cell according to Example 6-1.

FIG. 14 is a diagram presenting voltage-dependent current density of an organic solar cell according to Example 6-2.

101: Substrate
102: Cathode
103: Cathode Buffer Layer
104: Photoactive Layer
105: Anode
106: Organic Material Layer Including Fullerene Derivative
107: Anti-Reflective Film

MODE FOR THE DISCLOSURE

Hereinafter, the present specification will be described in detail.

In the present specification, a 'unit' is a repeated structure included in a monomer of a copolymer, and means a structure in which the monomer bonds in the copolymer by polymerization.

In the present specification, the meaning of 'including a unit' means being included in a main chain in a polymer.

A copolymer according to one embodiment of the present specification includes a first unit represented by Chemical Formula 1 and a second unit represented by Chemical Formula 2.

The first unit and the second unit are provided so that S atoms of the thienothiophene groups are selectively disposed close to each other.

In other words, the first unit represented by Chemical Formula 1 and the second unit represented by Chemical Formula 2 included in the copolymer according to one embodiment of the present specification have regio-regularity bonding in a certain direction in the copolymer. The copolymer having regio-regularity according to one embodiment of the present specification has relatively excellent crystallinity.

Regio-regularity in the present specification means steadily maintaining a direction in which a certain structure bonds selectively in a copolymer.

The copolymer according to one embodiment of the present specification includes a structure in which two thiophene groups are fused, and therefore, may induce high electron density and/or stabilization of the resonance structure in a device.

The first unit represented by Chemical Formula 1 according to one embodiment of the present specification has regio-selectivity by providing thienothiophene on both sides based on benzodithiophene, and providing fluorine at a position relatively far from the benzodithiophene. In this case, crystallinity is superior.

Regio-selectivity in the present specification means selectively providing a substituent in a certain direction in a structure inside a copolymer.

As above, a compound may be readily prepared by increasing selectivity of a reaction in a copolymer including the unit represented by Chemical Formula 1 substituted with fluorine, and the prepared copolymer may have increased charge mobility in an organic electronic device such as an organic transistor including an organic solar cell by having excellent crystallinity.

In addition, an absolute value of a highest occupied molecular orbital (HOMO) energy level of the copolymer increases by the introduction of fluorine, and an increase in the open voltage may be expected.

Benzodithiophene of the first unit represented by Chemical Formula 1 and the second unit represented by Chemical Formula 2 according to one embodiment of the present specification function as an electron donor, and thienothiophene of the first unit represented by Chemical Formula 1 relatively functions as an electron acceptor, and therefore, a push-pull effect may be expected for the copolymer including the first unit and the second unit. In this case, a low band gap is formed, and the substitution position of fluorine has certain directivity based on benzodithiophene of the first unit represented by Chemical Formula 1, and therefore, excellent crystallinity and/or enhanced charge mobility are obtained.

The copolymer according to one embodiment of the present specification includes the second unit represented by Chemical Formula 2.

The second unit represented by Chemical Formula 2 according to one embodiment of the present specification includes thiophene substituted with a sulfide group as a substituent of benzodithiophene. The sulfur-introduced sulfide substituent has π-acceptor properties and thereby has a deep HOMO energy level compared to other substituents without sulfur introduction, and as a result, an enhanced open voltage may be induced.

In one embodiment of the present specification, the copolymer includes a unit represented by the following Chemical Formula 3.

In one embodiment of the present specification, the first unit represented by Chemical Formula 1 is represented by the following Chemical Formula 1-1.

[Chemical Formula 1-1]

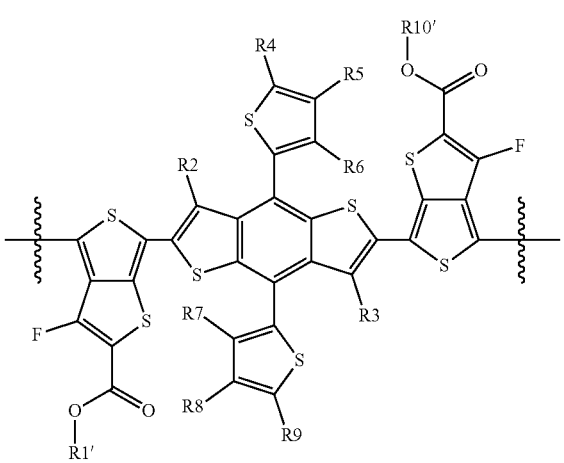

In Chemical Formula 1-1,

R2 to R9 have the same definitions as in Chemical Formula 1,

R1' and R10' are the same as or different from each other, and each independently have the same definitions as R2 to R9.

In one embodiment of the present specification, R1' is a substituted or unsubstituted alkyl group.

In another embodiment, R1' is a substituted or unsubstituted alkyl group having 1 to 30 carbon atoms.

In one embodiment of the present specification, R1' is a substituted or unsubstituted ethylhexyl group.

[Chemical Formula 3]

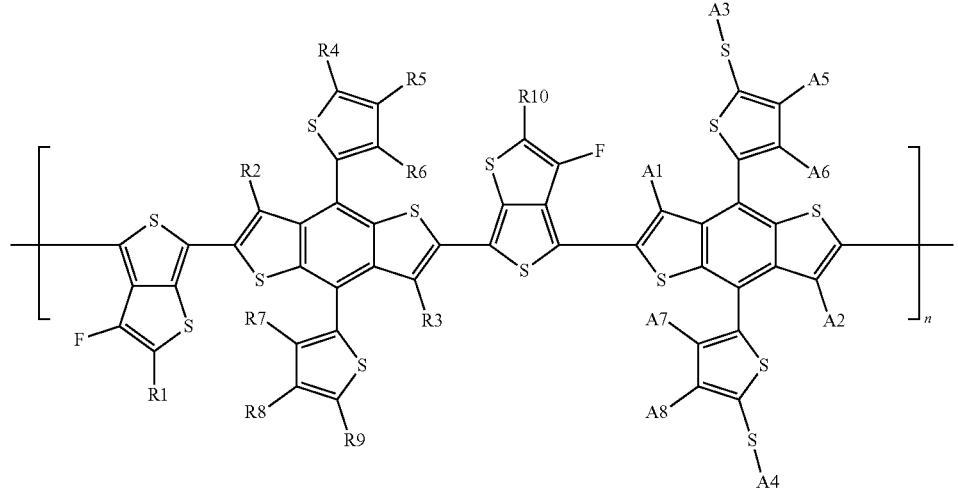

In Chemical Formula 3, n is an integer of 1 to 10,000,

R1 to R10 and A1 to A8 have the same definitions as in Chemical Formulae 1 and 2.

In another embodiment, R1 and R10 are the same as or different from each other, and each independently a substituted or unsubstituted ester group.

In one embodiment of the present specification, R1' is an ethylhexyl group.

In one embodiment of the present specification, R10' is a substituted or unsubstituted alkyl group.

In another embodiment, R10' is a substituted or unsubstituted alkyl group having 1 to 30 carbon atoms.

In one embodiment of the present specification, R10' is a substituted or unsubstituted ethylhexyl group.

In one embodiment of the present specification, R10' is an ethylhexyl group.

In one embodiment of the present specification, R2 is hydrogen.

In one embodiment of the present specification, R3 is hydrogen.

In one embodiment of the present specification, R4 is a substituted or unsubstituted alkyl group.

In another embodiment, R4 is a substituted or unsubstituted alkyl group having 1 to 30 carbon atoms.

In one embodiment of the present specification, R4 is a substituted or unsubstituted ethylhexyl group.

In one embodiment of the present specification, R4 is an ethylhexyl group.

In one embodiment of the present specification, R5 is hydrogen.

In another embodiment, R6 is hydrogen.

In one embodiment of the present specification, R7 is hydrogen.

In another embodiment, R8 is hydrogen.

In one embodiment of the present specification, R9 is a substituted or unsubstituted alkyl group.

In another embodiment, R9 is a substituted or unsubstituted alkyl group having 1 to 30 carbon atoms.

In one embodiment of the present specification, R9 is a substituted or unsubstituted ethylhexyl group.

In one embodiment of the present specification, R9 is an ethylhexyl group.

In one embodiment of the present specification, A1 is hydrogen.

In another embodiment, A2 is hydrogen.

In one embodiment of the present specification, A3 is a substituted or unsubstituted alkyl group.

In another embodiment, A3 is a substituted or unsubstituted alkyl group having 1 to 30 carbon atoms.

In one embodiment of the present specification, A3 is a substituted or unsubstituted ethylhexyl group.

In one embodiment of the present specification, A3 is an ethylhexyl group.

In one embodiment of the present specification, A4 is a substituted or unsubstituted alkyl group.

In another embodiment, A4 is a substituted or unsubstituted alkyl group having 1 to 30 carbon atoms.

In one embodiment of the present specification, A4 is a substituted or unsubstituted ethylhexyl group.

In one embodiment of the present specification, A4 is an ethylhexyl group.

In one embodiment of the present specification, A5 is hydrogen.

In another embodiment, A6 is hydrogen.

In another embodiment, A7 is hydrogen.

In another embodiment, A8 is hydrogen.

In one embodiment of the present specification, the copolymer includes a unit represented by the following Chemical Formula 3-1.

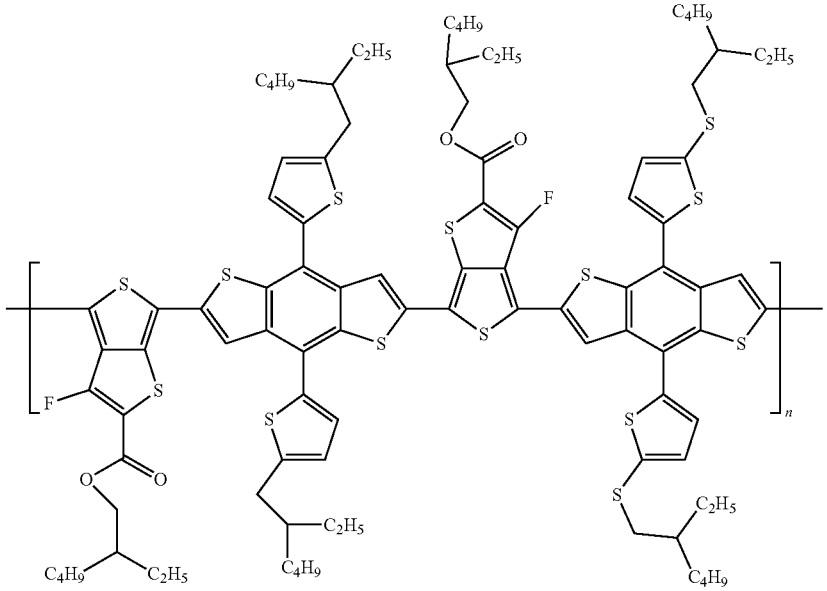

[Chemical Formula 3-1]

In Chemical Formula 3-1, n is an integer of 1 to 10,000.

Examples of the substituents are described below, however, the substituents are not limited thereto.

In the present specification,

means a site bonding to other substituents or bonding sites.

The term "substitution" in the present specification means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term "substituted or unsubstituted" in the present specification means being substituted with one or more substituents selected from the group consisting of deuterium; a halogen group; a nitrile group; a nitro group; an ester group; a hydroxyl group; an alkyl group; an alkoxy group; an alkenyl group; an aryl group; an amine group; and a heterocyclic group, or being unsubstituted, or being substituted with a substituent linking two or more substituents among the substituents illustrated above, or being unsubstituted. For example, "a substituent linking two or more substituents" may include a biphenyl group. In other words, a biphenyl group may be an aryl group, or interpreted as a substituent linking two phenyl groups.

In the present specification, examples of the halogen group may include fluorine, chlorine, bromine or iodine.

In the present specification, the alkyl group may be linear, branched or cyclic, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

The alkyl group may be substituted with an aryl group or a heteroaryl group to function as an arylalkyl group or a heteroarylalkyl group. The aryl group or the heterocyclic group may be selected from among examples of the aryl group or the heterocyclic group to describe later.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benxyloxy, p-methylbenxyloxy and the like, but are not limited thereto.

The alkoxy group may be substituted with an aryl group or a heteroaryl group to function as an aryloxy group or a heteroaryloxy group. The aryl group or the heterocyclic group may be selected from among examples of the aryl group or the heterocyclic group to describe later.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

The alkenyl group may be substituted with an aryl group or a heteroaryl group to function as an arylalkenyl group or a heteroarylalkenyl group. The aryl group or the heterocyclic group may be selected from among examples of the aryl group or the heterocyclic group to describe later.

When the aryl group is a monocyclic aryl group in the present specification, the number of carbon atoms is not particularly limited, but is preferably from 6 to 25. Specific examples of the monocyclic aryl group may include a phenyl group, a biphenyl group, a terphenyl group, a quaterphenyl group and the like, but are not limited thereto.

When the aryl group is a multicyclic aryl group, the number of carbon atoms is not particularly limited, but is preferably from 10 to 30. Specific examples of the multicyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

When the fluorenyl group is substituted,

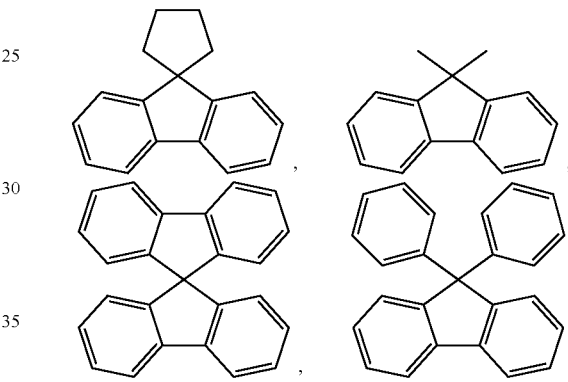

and the like may be included. However, the structure is not limited thereto.

The aryl group may be substituted with an alkyl group to function as an arylalkyl group. The alkyl group may be selected from among the above-described examples.

In the present specification, a general formula of the ester group may be represented by

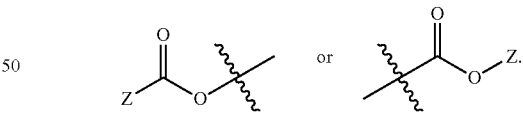

Z is hydrogen; a substituted or unsubstituted alkyl group having 1 to 20 carbon atoms; a substituted or unsubstituted cycloalkyl group having 3 to 60 carbon atoms; a substituted or unsubstituted arylalkyl group having 7 to 50 carbon atoms; a substituted or unsubstituted aryl group having 6 to 60 carbon atoms; or a substituted or unsubstituted heterocyclic group having 2 to 60 carbon atoms.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms of the heterocyclic group is not particularly limited, but is preferably from 2 to 60. Examples of the heterocyclic group may include a thiophene group, a furan group, a pyrrole group, an imidazole group, a thiazole group, an oxazole group, an oxadiazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group and the like, but are not limited thereto.

The heterocyclic group may be monocyclic or multicyclic, may be aromatic, aliphatic or a fused ring of aromatic and aliphatic.

In the present specification, the number of carbon atoms of the amine group is not particularly limited, but is preferably from 1 to 30. The amine group may be substituted with the alkyl group, the aryl group, the heterocyclic group, the alkenyl group, the cycloalkyl group and combinations thereof described above, and specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group and the like, but are not limited thereto.

In one embodiment of the present specification, an end group of the copolymer is a heterocyclic group or an aryl group.

In one embodiment of the present specification, an end group of the copolymer is a 4-(trifluoromethyl)phenyl group.

In one embodiment of the present specification, an end group of the copolymer is a bromo-thiophene group.

In another embodiment, an end group of the copolymer is a bromo-benzene group.

In another embodiment, an end group of the copolymer is a trialkyl(thiophen-2-yl)stannyl group.

In the present specification, the trialkyl may be trimethyl or tributyl.

According to one embodiment of the present specification, the copolymer preferably has a number average molecular weight of 500 g/mol to 1,000,000 g/mol. Preferably, the copolymer preferably has a number average molecular weight of 10,000 to 100,000. In one embodiment of the present specification, the copolymer has a number average molecular weight of 30,000 to 100,000.

According to one embodiment of the present specification, the copolymer may have molecular weight distribution of 1 to 100. Preferably, the copolymer has molecular weight distribution of 1 to 3.

As the molecular weight distribution decreases and the number average molecular weight increases, favorable electrical properties and mechanical properties are obtained.

In addition, the number average molecular weight is preferably 100,000 or less so as to have solubility at a certain level or higher and have an advantage of using a solution coating method.

In one embodiment of the present specification, the copolymer has solubility of 10 mg/mL or higher for a toluene or xylene solvent. In this case, the process may be carried out in a non-halogen (non-chlorinated) solvent, and environmental problems caused from using a halogen solvent may be overcome when manufacturing an organic solar cell.

The copolymer according to the present specification may be prepared using a multi-step chemical reaction. After preparing monomers through an alkylation reaction, a Grignard reaction, a Suzuki coupling reaction, a Stille coupling reaction and the like, final copolymers may be prepared through a carbon-carbon coupling reaction such as a Stille coupling reaction. When a substituent to introduce is a boronic acid or a boronic ester compound, a Suzuki coupling reaction may be used, and when a substituent to introduce is a tributyltin or trimethyltin compound, a Stille coupling reaction may be used, however, the method is not limited thereto.

One embodiment of the present specification provides an organic solar cell including a first electrode; a second electrode provided opposite to the first electrode; and one or more organic material layers provided between the first electrode and the second electrode and including a photoactive layer, wherein one or more layers of the organic material layers include the copolymer.

The organic solar cell according to one embodiment of the present specification includes a first electrode, a photoactive layer and a second electrode. The organic solar cell may further include a substrate, a hole extraction layer and/or an electron extraction layer.

In one embodiment of the present specification, when the organic solar cell receives photons from an external light source, electrons and holes are generated between an electron donor and an electron acceptor. The generated holes are transferred to an anode through the electron donor layer.

In one embodiment of the present specification, the organic material layer includes a hole transfer layer, a hole injection layer, or a layer carrying out hole transfer and hole injection at the same time, and the hole transfer layer, the hole injection layer, or the layer carrying out hole transfer and hole injection at the same time includes the copolymer.

In another embodiment, the organic material layer includes an electron injection layer, an electron transfer layer, or a layer carrying out electron injection and electron transfer at the same time, and the electron injection layer, the electron transfer layer, or the layer carrying out electron injection and electron transfer at the same time includes the copolymer.

FIG. 1 is a diagram illustrating an organic solar cell according to one embodiment of the present specification.

As illustrated in FIG. 1, the organic solar cell may be an inverted-structured organic solar cell including a substrate (101), a cathode (102) on the substrate, a cathode buffer layer (103) on the cathode, a photoactive layer (104) on the cathode buffer layer, and an anode (105) on the photoactive layer.

In addition, the organic solar cell may be a normal-structured solar cell providing an anode on a substrate without being limited to FIG. 1.

In one embodiment of the present specification, an anode buffer layer may be further provided between the photoactive layer and the anode as in FIG. 2.

In another embodiment, an organic material layer (106) including a fullerene derivative may be further included between the photoactive layer and the cathode buffer layer. The organic material layer including a fullerene derivative will be described later.

In another embodiment, as in FIG. 3, an anti-reflective film (107) may be further included on a surface of the substrate opposite to the surface of the substrate provided with the cathode. The anti-reflective film will be described later.

In one embodiment of the present specification, when the organic solar cell receives photons from an external light source, electrons and holes are generated between an electron donor and an electron acceptor. The generated holes are transferred to an anode through the electron donor layer.

In one embodiment of the present specification, the organic solar cell may further include additional organic material layers. The organic solar cell may reduce the number of organic material layers by using an organic material having various functions at the same time.

In one embodiment of the present specification, the first electrode is an anode, and the second electrode is a cathode. In another embodiment, the first electrode is a cathode, and the second electrode is an anode.

In one embodiment of the present specification, the organic solar cell may have a structure in which the cathode, the photoactive layer and the anode are arranged in consecutive order, or may have a structure in which the anode, the photoactive layer and the cathode are arranged in consecutive order, however, the structure is not limited thereto.

In another embodiment, the organic solar cell may have a structure in which the anode, the hole transfer layer, the photoactive layer, the electron transfer layer and the cathode are arranged in consecutive order, or may have a structure in which the cathode, the electron transfer layer, the photoactive layer, the hole transfer layer and the anode are arranged in consecutive order, however, the structure is not limited thereto.

In one embodiment of the present specification, the organic solar cell has a normal structure.

In one embodiment of the present specification, the organic solar cell has an inverted structure.

The inverted-structured organic solar cell of the present specification may mean an organic solar cell in which an anode and a cathode of an organic solar cell having a general structure are formed in a reverse direction. An Al layer used in an organic solar cell having a general structure is very vulnerable to an oxidation reaction in the air, and has a limit in commercializing through a printing process since preparing in an ink form is difficult. However, the organic solar cell of the present specification having a structure in a reverse direction is capable of using Ag instead of Al, and therefore, is stable for an oxidation reaction compared to an organic solar cell having a general structure, and an Ag ink is readily prepared, which is advantageous in commercializing through a printing process.

In one embodiment of the present specification, the organic solar cell is an inverted-structured organic solar cell in which the first electrode is a cathode and the second electrode is an anode, and the organic solar cell further includes a cathode buffer layer provided between the photoactive layer and the first electrode; and an organic material layer including a fullerene derivative between the photoactive layer and the cathode buffer layer.

In the present specification, the cathode buffer layer may mean an electron extraction layer.

In one embodiment of the present specification, one, two or more are selected from the group consisting of conductive oxides and metals as the cathode buffer layer.

According to one embodiment of the present specification, the conductive oxide of the cathode buffer layer may be an electron-extracting metal oxide, and specifically, may include one or more types selected from the group consisting of titanium oxide ($TiO_x$); zinc oxide (ZnO); and cesium carbonate ($Cs_2CO_3$).

According to one embodiment of the present specification, the metal may be a core shell material including silver (Ag) nanoparticles, gold (Au) nanoparticle, and metal oxides such as $Ag-SiO_2$, $Ag-TiO_2$ or $Au-TiO_2$. The core shell material includes the metal as a core, and includes the metal oxide such as $Ag-SiO_2$, $Ag-TiO_2$ or $Au-TiO_2$ as a shell.

The organic solar cell according to one embodiment of the present specification may increase efficiency of the organic solar cell by including the cathode buffer layer, and by foaming chemical bonds with the organic layer including a fullerene derivative, may increase device stability and maximize electron migration in the device.

In one embodiment of the present specification, the cathode buffer layer may include ZnO.

In another embodiment of the present specification, the organic material layer including a fullerene derivative may include $C_{60}$.

In one embodiment of the present specification, the fullerene derivative may be formed by a self-phase separation between the photoactive layer material and the organic material layer including a fullerene derivative. At an interface of two layers formed by the phase separation in one embodiment of the present specification, materials of the two layers may be partly mixed. This allows changes in the energy level to be in a continuous (cascade) mode. Accordingly, it may be advantageous in charge transfer and charge collection. In addition, by the phase separation, materials of the layer including the fullerene derivative are present on the photoactive layer surface, and therefore, changes in the surface energy may occur by a vacuum level shift.

In the present specification, the "phase separation" means two or more materials forming a layer in a uniformly mixed state by being separated from each other without a separate process due to different affinity.

Specifically, the material including the fullerene derivative may be separated by increasing hydrophilicity through increasing an amount of a hydrophilic crown-type substituent, or may be separated by increasing hydrophobicity by introducing a hydrophobic substituent to the fullerene derivative.

In one embodiment of the present specification, the photoactive layer and the layer including the fullerene derivative are provided adjoining each other. Physical bonding or chemical bonding is not limited when being provided adjoining each other.

In one embodiment of the present specification, the photoactive layer and the layer including the fullerene derivative are formed by adjoining at the same time using a self-phase separation of the photoactive layer and the layer including the fullerene derivative.

The fullerene derivative of the organic material layer including the fullerene derivative according to one embodiment of the present specification may use fullerene derivatives with an anchoring group such as a carboxylic acid group introduced thereto, but is not limited thereto.

In one embodiment of the present specification, the organic solar cell further includes an anti-reflective film (light enhancement film) on a surface of the first electrode opposite to the surface provided with the photoactive layer.

In one embodiment of the present specification, the organic solar cell includes an anti-reflective film on a surface of the first electrode opposite to the surface provided with the photoactive layer, may further include a substrate between the anti-reflective film and the first electrode, and the first electrode may be a cathode or an anode. In this case, light incident to a solar cell is not reflected, which enhances incidence. In other words, the anti-reflective film may be a film preventing reflection of incident light.

In one embodiment of the present specification, the organic solar cell has a tandem structure.

The organic solar cell according to one embodiment of the present invention may have one, two or more of the photoactive layers.

In another embodiment, a buffer layer may be provided between the photoactive layer and the hole extraction layer, or between the photoactive layer and the electron extraction layer.

In one embodiment of the present specification, the photoactive layer includes one, two or more selected from the group consisting of an electron donor and an electron acceptor, and the electron donor material includes the copolymer.

In one embodiment of the present specification, the electron acceptor may be selected from the group consisting of fullerene, fullerene derivatives, carbon nanotubes, carbon nanotube derivatives, bathocuproine, semiconducting elements, semiconducting compounds and combinations thereof. Specifically, one, two or more compounds selected from the group consisting of fullerene, fullerene derivatives ((6,6)-phenyl-$C_{61}$-butyric acid-methylester (PCBM) or (6,6)-phenyl-$C_{61}$-butyric acid-cholesteryl ester (PCBCR)), perylene, polybenzimidazole (PBI), and 3,4,9,10-perylene-tetracarboxylic bis-benzimidazole (PTCBI) may be included.

In one embodiment of the present specification, the electron donor and the electron acceptor form a bulk heterojunction (BHJ).

A Bulk heterojunction means an electron donor material and an electron acceptor material being mixed together in a photoactive layer.

In one embodiment of the present specification, the photoactive layer has a bilayer structure including an n-type organic material layer and a p-type organic material layer, and the p-type organic material layer includes the copolymer.

In one embodiment of the present specification, the photoactive layer further includes an additive.

In one embodiment of the present specification, the additive has a molecular weight of 50 g/mol to 300 g/mol.

In another embodiment, the additive is an organic material having a boiling point of 30° C. to 300° C.

In the present specification, the organic material means a material including at least one or more carbon atoms.

In one embodiment, the additive may further include one or two types of additives among additives selected from the group consisting of 1,8-diiodooctane (DIO), 1-chloronaphthalene (1-CN), diphenyl ether (DPE), octanedithiol, para-anisaldehyde and tetrabromothiophene.

For smooth separation of excitons and effective transport of separated charges in an organic solar cell, an interface between an electron donor and an electron acceptor needs to be maximally increased, and enhancing morphology is also required by securing a continuous path of the electron donor and the electron acceptor through a proper phase separation.

According to one embodiment of the present specification, an effective phase separation induced by selective solubility of the polymer and the fullerene derivative for an additive, and a difference in the boiling points between the solvent and the additive may be induced by introducing the additive to the active layer. In addition, the phase separation may be prevented by fixing morphology through crosslinking the electron acceptor material or the electron donor material, and morphology may be controlled also through changes in the molecular structure of the electron donor material.

Additionally, morphology may be enhanced through post treatment such as heat treatment at a high temperature as well as enhancing morphology through controlling stereoregularity of the electron donor material. This may induce orientation and crystallization of the polymer according to one embodiment of the present specification, and may increase roughness of the photoactive layer, and as a result, may induce effective charge migration by facilitating a contact with an electrode.

One embodiment of the present specification also provides a method for manufacturing an organic solar cell including preparing a substrate; forming a first electrode on one region of the substrate; forming an organic material layer including a photoactive layer on a top of the first electrode; and forming a second electrode on the organic material layer, wherein the photoactive layer includes the copolymer.

In one embodiment of the present specification, the photoactive layer is formed using a solution including a non-halogen solvent and the copolymer. The copolymer according to one embodiment of the present specification is dissolved in a non-halogen solvent, and therefore, may be processed in a non-halogen (non-chlorinated) solvent, and as a result, environmental problems caused by using a halogen solvent may be overcome when manufacturing an organic solar cell.

In another embodiment of the present specification, attaching the anti-reflective film on a surface opposite to the first electrode-formed surface may be further included before or after the preparing of a substrate and the forming of a first electrode.

The anti-reflective film is the same as described above.

In another embodiment, the forming of an organic material layer including a photoactive layer may include coating a composition including a photoactive layer material and an organic material layer material including a fullerene derivative, and the photoactive layer and the organic material layer including a fullerene derivative may be formed at the same time due to a phase separation of the photoactive layer material and the layer material including a fullerene derivative. In this case, a double layer of the photoactive layer/the organic material layer including a fullerene derivative may be formed. The organic material layer including a fullerene derivative is a buffer layer and functions in an organic solar cell, and therefore, a double layer of the photoactive layer and the layer including a fullerene derivative may be formed in a single process without a separate process preparing a buffer layer.

The substrate in the present specification may include a glass substrate or a transparent plastic substrate having excellent transparency, surface smoothness, handling easiness and water resistance, but is not limited thereto, and substrates typically used in organic solar cells may be used without limit. Specific examples thereof include glass, polyethylene terphthalate (PET), polyethylene naphthalate (PEN), polypropylene (PP), polyimide (PI), triacetyl cellulose (TAC) and the like, but are not limited thereto.

The anode electrode may include a material that is transparent and has excellent conductivity, but is not limited thereto. Examples of the anode material include metals such as vanadium, chromium, copper, zinc or gold, or alloys thereof; metal oxides such as zinc oxides, indium oxides, indium tin oxides (ITO) or indium zinc oxides (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

A method of forming the anode electrode is not particularly limited, however, the anode electrode may be formed by being applied to one surface of a substrate or coated in the form of a film using a method such as sputtering, E-beam, thermal deposition, spin coating, screen printing, inkjet printing, doctor blade or gravure printing.

When the anode electrode is formed on a substrate, the result may go through processes of cleaning, dehydrating and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to remove moisture, and when the substrate is completely cleaned, the substrate surface is modified to be hydrophilic.

Through the surface modification such as above, the junctional surface potential may be maintained at a level suitable for the surface potential of the photoactive layer. In addition, when a surface is modified, a polymer thin film may be readily formed on the anode electrode, and the quality of the thin film may be improved.

Preprocessing technologies for the anode electrode include a) a surface oxidation method using parallel plate discharge, b) a method of oxidizing the surface through ozone generated by UV rays in a vacuum, and c) an oxidation method using the oxygen radicals generated by plasma.

One of the methods described above may be selected depending on the condition of the anode electrode or the substrate. However, it is commonly preferred to prevent the leave of oxygen on the surface of the anode electrode or the substrate and to suppress the remaining of moisture and organic materials as much as possible, no matter which method is used. In this case, practical effects of the preprocessing may be maximized.

As a specific example, a method of oxidizing the surface through ozone generated by UV rays may be used. Herein, the patterned ITO substrate may be fully dried by baking the patterned ITO substrate on a hot plate after being ultrasonic cleaned, and the patterned ITO substrate is introduced into a chamber and then may be cleaned by ozone generated by reacting oxygen gas with UV light using a UV lamp.

However, the method of surface modification of the patterned ITO substrate in the present specification is not particularly limited, and any method oxidizing a substrate may be used.

The cathode electrode may include a metal having small work function, but is not limited thereto. Specific examples thereof may include metals such as magnesium, calcium, sodium, potassium, titanium, indium, yttrium, lithium, gadolinium, aluminum, silver, tin and lead, or alloys thereof; or multilayer structure materials such as LiF/Al, LiO$_2$/Al, LiF/Fe, Al:Li, Al:BaF$_2$ and Al:BaF$_2$:Ba, but are not limited thereto.

The cathode electrode may be formed by being deposited inside a thermal depositor having a vacuum degree of 5×10$^{-7}$ torr or less, but the formation is not limited to this method.

The hole extraction layer and/or the electron extraction layer material play a role of efficiently transferring the electrons and the holes separated in the photoactive layer to an electrode, and the material is not particularly limited.

The hole extraction layer material may include poly(3,4-ethylenediocythiophene) doped with poly(styrenesulfonic acid) (PEDOT:PSS), molybdenum oxides (MoO$_x$); vanadium oxide (V$_2$O$_5$); nickel oxide (NiO); tungsten oxides (WO$_x$), and the like, but is not limited thereto.

The electron extraction layer material may include electron-extracting metal oxides, and may specifically include a metal complex of 8-hydroxyquinoline; a complex including Alq$_3$; a metal complex including Liq; LiF; Ca; titanium oxides (TiO$_x$); zinc oxide (ZnO); cesium carbonate (Cs$_2$CO$_3$), and the like, but is not limited thereto.

The photoactive layer may be formed by dissolving a photoactive material such as an electron donor and/or an electron acceptor in an organic solvent, and then applying the solution using a method such as spin coating, dip coating, screen printing, spray coating, doctor blade and brush painting, but the method is not limited thereto.

Hereinafter, the present specification will be described in detail with reference to examples and examples in order to specifically describe the present specification. However, examples according to the present specification may be modified to various different forms, and the scope of the present specification is not construed as being limited to the examples described below. Examples of the present specification are provided in order to more fully describe the present specification to those having average knowledge in the art.

PREPARATION EXAMPLE 1

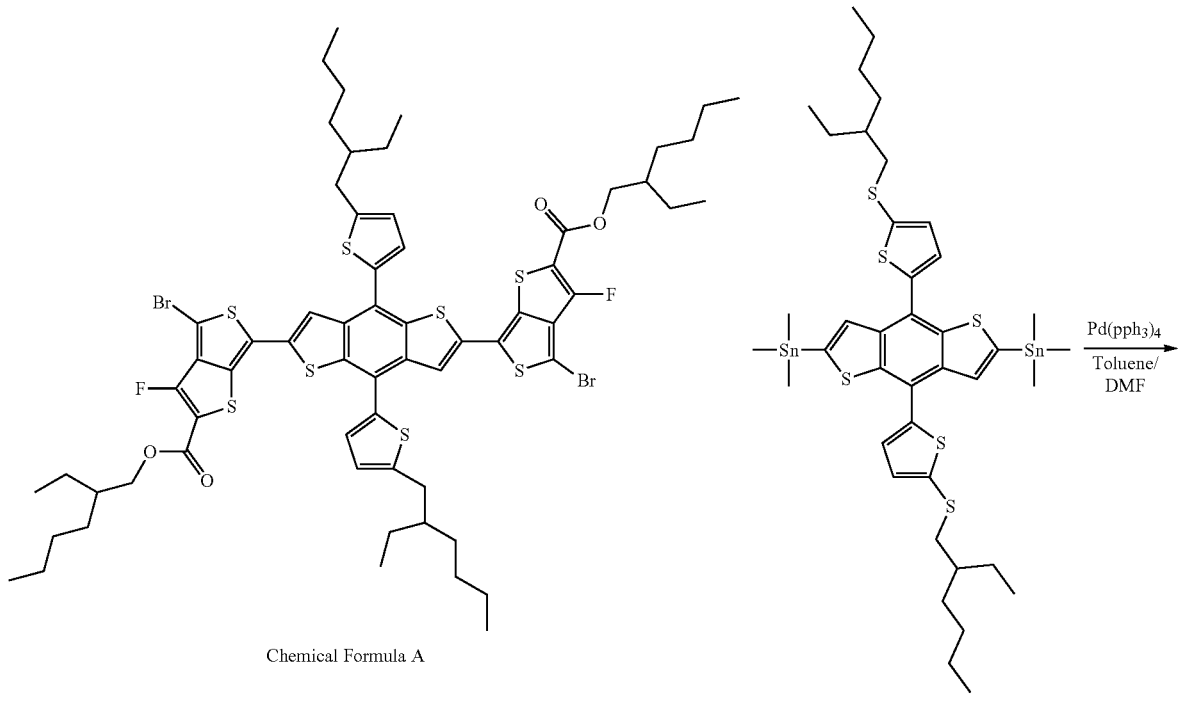

Chemical Formula A

Chemical Formula B

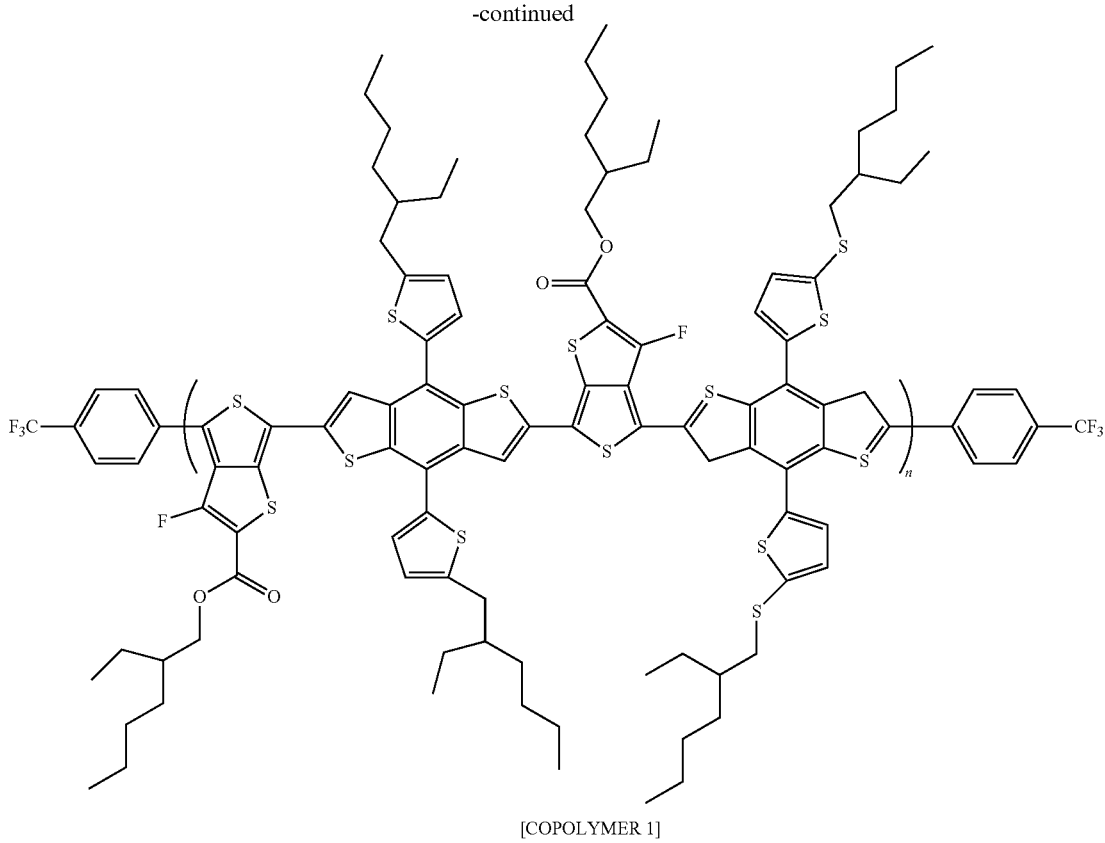

[COPOLYMER 1]

Under nitrogen atmosphere, a solution was prepared by introducing Chemical Formula A and Chemical Formula B to 5 ml of toluene and 3 ml of dimethylformamide (DMF) in a 100 ml flask. The solution was bubbled for 30 minutes with nitrogen, and Pd(pph$_3$)$_4$ was mixed thereto. The solution was stirred for 72 hours at 100° C. After that, the solution to which 0.5 ml of bromo-benzotrifluoride was added was further stirred for 48 hours, and cooled to room temperature. After that, the mixture was poured into 100 ml of methanol (MeOH). The precipitated polymer was collected through filtration, and the collected polymer was Soxhlet extracted with an order of methanol, acetone, hexane, chloroform and chlorobenzene. The result was concentrated with chloroform and chlorobenzene extraction, and poured into methanol to precipitate a polymer. The precipitated polymer was filtered again and dried overnight under vacuum. In each of the chloroform and the chlorobenzene, black-purple shiny and purified polymers were obtained in the following quantities.

Chloroform (CF): 76 mg, chlorobenzene (CB): 332 mg (total yield: 94%)

Gel permeation chromatography (GPC for CB fraction): Mn=31300, PDI=1.71

COMPARATIVE PREPARATION EXAMPLE 1

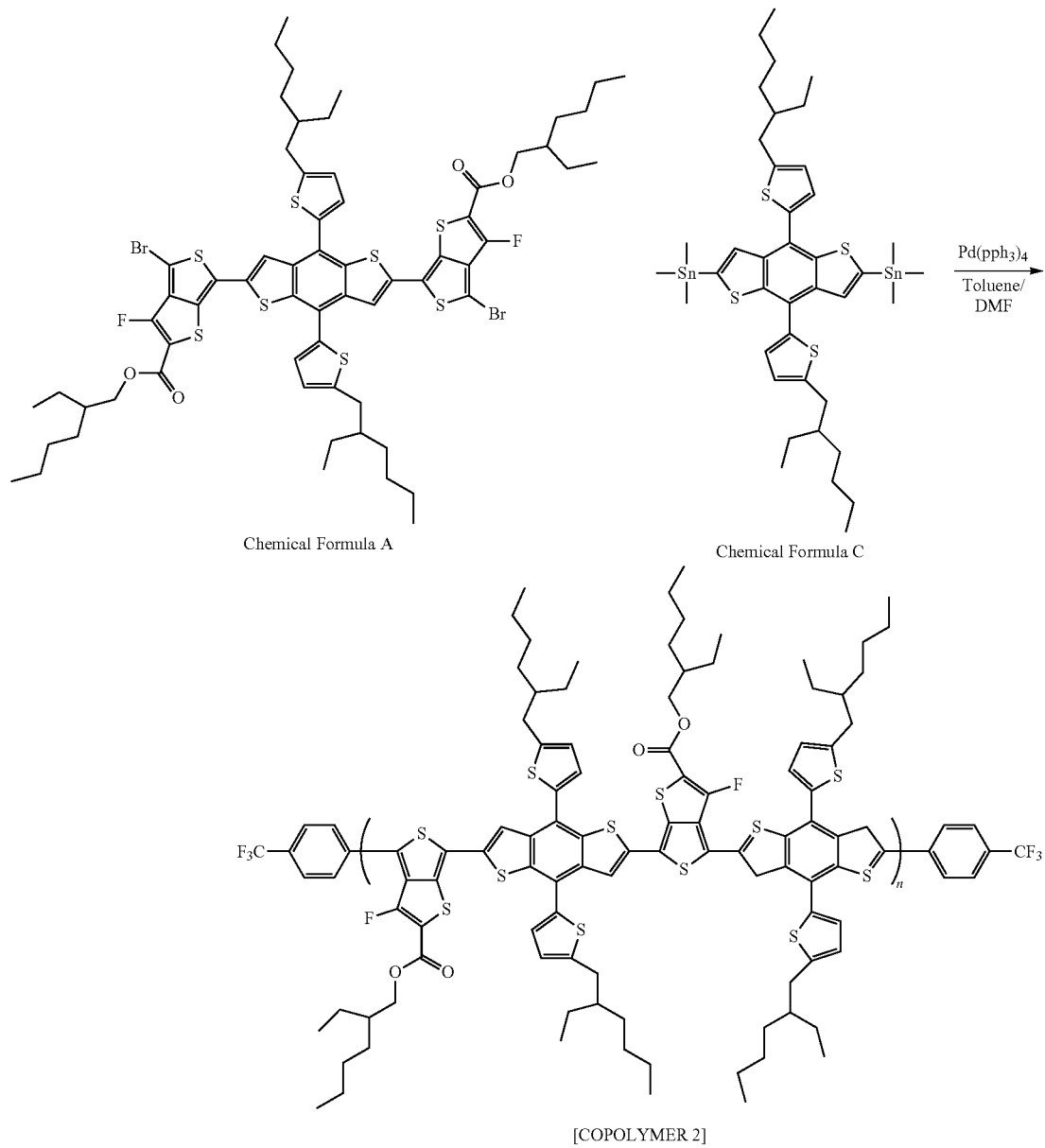

Chemical Formula A

Chemical Formula C

[COPOLYMER 2]

Under nitrogen atmosphere, a solution was prepared by introducing Chemical Formula A and Chemical Formula C to 5 ml of toluene and 3 ml of dimethylformamide (DMF) in a 100 ml flask. The solution was bubbled for 30 minutes with nitrogen, and Pd(pph$_3$)$_4$ was mixed thereto. The solution was stirred for 72 hours at 100° C. After that, the solution to which 0.5 ml of bromo-benzotrifluoride was added was further stirred for 48 hours, and cooled to room temperature. After that, the mixture was poured into 100 ml of methanol (MeOH). The precipitated polymer was collected through filtration, and the collected polymer was Soxhlet extracted with an order of methanol, acetone, hexane, chloroform and chlorobenzene. The result was concentrated with chloroform and chlorobenzene extraction, and poured into methanol to precipitate a polymer. The precipitated polymer was filtered again and dried overnight under vacuum. In each of the chloroform and the chlorobenzene, black-purple shiny and purified polymers were obtained in the following quantities.

Chloroform (CF): 204 mg, chlorobenzene (CB): 164 mg (93.8%)

Gel permeation chromatography (GPC for CB fraction): Mn=39300, PDI=1.56

EXAMPLE 1

Results of measuring properties of copolymers 1 and 2 prepared in Preparation Example 1 and Comparative Preparation Example 1, and properties of general copolymers having the following structures are as shown in Table 1.

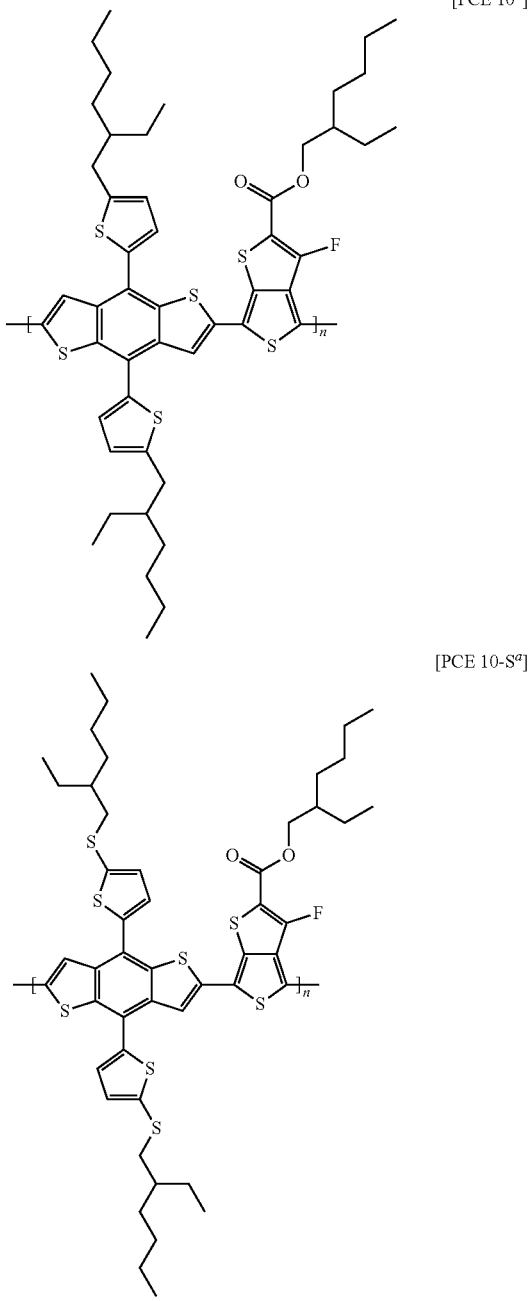

[PCE 10<sup>a</sup>]

[PCE 10-S<sup>a</sup>]

TABLE 1

|  | $\lambda_{max}$ (CB) (nm) | $\lambda_{max}$ (film) (nm) | $\lambda_{Op.BG}$ (eV) | $\lambda_{Ec.BG}$ (eV) | HOMO (eV) |
|---|---|---|---|---|---|
| Copolymer 1 | 705 | 710 | 1.58 | 1.38 | 5.22 |
| Copolymer 2 | 695 | 695 | 1.61 | 1.52 | 5.2 |
| PCE 10<sup>a</sup> | 708 | 704 | 1.59 | 2.13 | 5.30 |
| PCE10-S<sup>a</sup> | 709 | 716 | 1.57 | 2.14 | 5.41 |

In Table 1, $\lambda_{max}$ (CB) means a maximum value (max) of an absorption wavelength when measuring a UV spectrum by diluting each of the copolymers in chlorobenzene, and $\lambda_{max}$ (film) means a maximum value of an adsorption spectrum when measuring a UV spectrum after spin coating each of the copolymers dissolved in chlorobenzene. $\lambda_{Op.BG}$ means an optical band gap and is a value measured through a UV onset of the film, and $\lambda_{Ec.BG}$ is a band gap measured through a cyclic voltammetry (CV) method. The HOMO energy level value is a value measured using an oxidation onset through a cyclic voltammetry (CV) method.

Based on the results of Table 1, it was identified that copolymers 1 and 2 having substituent regio-selectivity and regio-regularity have a proper HOMO energy level compared to PCE 10<sup>a</sup> or PCE 10-S<sup>a</sup> that does not have substituent regio-selectivity or regio-regularity.

FIG. 4 is a diagram presenting UV-vis absorption spectra of copolymer 1 at room temperature, 80° C. and 100° C. while being dissolved in chlorobenzene.

FIG. 5 is a diagram presenting UV-vis absorption spectra of copolymer 1 in a solution state dissolved in chlorobenzene, in a film state, and after heat treatment at 110° C. in a film state.

FIG. 6 is a diagram presenting an electrochemical measurement result (cyclic voltammetry) of copolymer 1.

FIG. 7 is a diagram presenting UV-vis absorption spectra of copolymer 2 at room temperature, 80° C. and 100° C. while being dissolved in chlorobenzene.

FIG. 8 is a diagram presenting UV-vis absorption spectra of copolymer 2 in a solution state dissolved in chlorobenzene, in a film state, and after heat treatment at 110° C. in a film state.

FIG. 9 is a diagram presenting an electrochemical measurement result (cyclic voltammetry) of copolymer 2.

EXAMPLES 1-1 TO 1-4

Manufacture of Organic Solar Cell

A composite solution was prepared by dissolving the copolymer 1 and $PC_{71}BM$ in chlorobenzene (CB) in 1:1.5, and 3 vol % of 1,8-diiodooctane (DIO) was added thereto. Herein, the concentration was adjusted as in the following Table 2, and the organic solar cell employed a structure of glass substrate/ITO/ZnO/photoactive layer/$MoO_3$/Ag. The glass substrate coated with bar-type ITO in 1.5 cm²×1.5 cm² was ultrasonic cleaned using distilled water, acetone and 2-propanol, and after the ITO surface was ozone treated for 10 minutes, the surface was spin-coated with zinc oxide (ZnO) to a thickness of 20 nm for 40 seconds at 1500 rpm, and then heat treated for 10 minutes at 235° C. In order to coat the photoactive layer, the copolymer $PC_{71}BM$ composite solution was spin coated to a thickness described in the following Table 2 for 20 seconds at 1,000 rpm, and using a thermal evaporator under a vacuum of $3\times10^{-8}$ torr, $MoO_3$ was deposited to a thickness of 10 nm at a rate of 0.2 Å/s, and Ag was deposited to a thickness of 100 nm at a rate of 1 Å/s to manufacture an organic solar cell having optimal performance.

COMPARATIVE EXAMPLES 1-1 TO 1-3

Organic solar cells were manufactured in the same manner as in Examples 1-1 to 1-4 except that copolymer 2 was used instead of copolymer 1, and the organic solar cells were manufactured to have ratios, concentrations and thicknesses of the following Table 2.

Photoelectric conversion properties of the organic solar cells manufactured in Examples 1-1 to 1-4 and Comparative Examples 1-1 to 1-3 were measured under a condition of 100 mW/cm² (AM 1.5), and the results are shown in the following Table 2.

TABLE 2

| | Concentration (mg/ml) | $V_{oc}$ (V) | $J_{sc}$ (mA/cm$^2$) | FF (%) | PCE (%) | Thickness (nm) |
|---|---|---|---|---|---|---|
| Example 1-1 | 10 | 0.73 | 8.48 | 49.51 | 3.04 | 45-55 |
| Example 1-2 | 15 | 0.78 | 14.49 | 64.50 | 7.28 | 70-77 |
| Example 1-3 | 20 | 0.81 | 16.96 | 65.51 | 8.97 | 80-88 |
| Example 1-4 | 25 | 0.78 | 16.35 | 62.79 | 7.98 | 100-110 |
| Comparative Example 1-1 | 15 | 0.78 | 15.36 | 59.08 | 7.04 | 80-85 |
| Comparative Example 1-2 | 20 | 0.76 | 14.51 | 47.90 | 5.30 | 92-99 |
| Comparative Example 1-3 | 25 | 0.75 | 14.25 | 46.01 | 4.92 | 105-110 |

FIG. 10 is a diagram presenting voltage-dependent current density of the organic solar cells according to Examples 1-1 to 1-4.

EXAMPLE 2

An organic solar cell was manufactured in the same manner as in Examples 1-1 to 1-4 except that a structure of glass substrate/ITO/ZnO/photoactive layer (concentration: 20 mg/ml, thickness: 80 nm to 90 nm)/MoO$_3$/Ag was used instead of the structure of glass substrate/ITO/ZnO/photoactive layer/MoO$_3$/Ag.

EXAMPLE 3

An organic solar cell was manufactured in the same manner as in Example 2 except that a structure of anti-reflective film/glass substrate/ITO/ZnO/photoactive layer (80 nm to 90 nm)/MoO$_3$/Ag was used instead of the structure of glass substrate/ITO/ZnO/photoactive layer/MoO$_3$/Ag.

EXAMPLE 4

An organic solar cell was manufactured in the same manner as in Example 2 except that a structure of glass substrate/ITO/ZnO/organic material layer including C$_{60}$/photoactive layer/MoO$_3$/Ag was used instead of the structure of glass substrate/ITO/ZnO/photoactive layer/MoO$_3$/Ag.

EXAMPLE 5

An organic solar cell was manufactured in the same manner as in Example 2 except that a structure of anti-reflective film/glass substrate/ITO/ZnO/organic material layer including C$_{60}$/photoactive layer/MoO$_3$/Ag was used instead of the structure of glass substrate/ITO/ZnO/photoactive layer/MoO$_3$/Ag.

Photoelectric conversion properties of the organic solar cells manufactured in Examples 2 to 5 were measured under a condition of 100 mW/cm$^2$ (AM 1.5), and the results are shown in the following Table 3.

TABLE 3

| | $V_{oc}$ (V) | $J_{sc}$ (mA/cm$^2$) | FF (%) | PCE (%) |
|---|---|---|---|---|
| Example 2 | 0.79 | 17.59 | 64.22 | 8.89 |
| Example 3 | 0.79 | 18.73 | 64.47 | 9.51 |
| Example 4 | 0.81 | 17.51 | 64.52 | 9.13 |
| Example 5 | 0.81 | 18.50 | 63.83 | 9.53 |

FIG. 11 is a diagram presenting voltage-dependent current density of the organic solar cells according to Examples 2 and 3.

FIG. 12 is a diagram presenting voltage-dependent current density of the organic solar cells according to Examples 4 and 5.

EXAMPLES 6-1 AND 6-2

Organic solar cells were manufactured in the same manner as in Example 2 except that the solvent and the photoactive layer thickness were adjusted as in the following Table 4.

COMPARATIVE EXAMPLE 6

An organic solar cell was manufactured in the same manner as in Example 2 except that copolymer 2 was used instead of copolymer 1, and the solvent and the photoactive layer thickness were adjusted as in the following Table 4.

Photoelectric conversion properties of the organic solar cells manufactured in Examples 6-1 and 6-2 were measured under a condition of 100 mW/cm$^2$ (AM 1.5), and the results are shown in the following Table 4.

TABLE 4

| | Solvent | $V_{oc}$ (V) | $J_{sc}$ (mA/cm$^2$) | FF (%) | PCE (%) | Thickness (nm) |
|---|---|---|---|---|---|---|
| Example 6-1 | Toluene | 0.79 | 17.24 | 64.80 | 8.84 | 80-90 |
| Example 6-2 | o-Xylene | 0.79 | 16.75 | 63.68 | 8.45 | 65-75 |
| Comparative Example 6 | Toluene | 0.77 | 16.34 | 56.74 | 7.09 | ~85 |

FIG. 13 is a diagram presenting voltage-dependent current density of the organic solar cell according to Example 6-1.

FIG. 14 is a diagram presenting voltage-dependent current density of the organic solar cell according to Example 6-2.

The $V_{oc}$ means an open voltage, the $J_{sc}$ means a short-circuit current, the FF means a fill factor, and the PCE means power conversion efficiency. The open voltage and the short-circuit current are each an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open voltage. The power conversion efficiency may be obtained when these three values are divided by the intensity of irradiated light, and it is preferred as the value is higher.

Based on the results of Table 2, it was identified that the copolymer according to one embodiment of the present specification exhibited excellent effects when, as a second unit, including thiophene substituted with a sulfide group as a substituent of benzodithiophene.

In addition, based on the results of Table 4, it was identified that an organic solar cell having high efficiency may be manufactured even when manufacturing the organic solar cell using a non-halogen solvent.

The invention claimed is:
1. A copolymer comprising a unit of Chemical Formula 3:

[Chemical Formula 3]

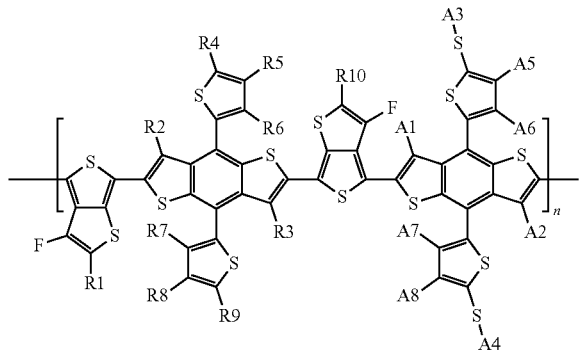

wherein n is an integer of 1 to 10,000,
R1 and R10 are the same as or different from each other and are each independently an unsubstituted ester group,
R2, R3, A1, A2, A5, A6, A7 and A8 are each hydrogen,
one of R4, R5 and R6 is an alkyl group, and the others are each hydrogen,
one of R7, R8 and R9 is an alkyl group, and the others are each hydrogen,
A3 and A4 are the same as or different from each other and are each independently an alkyl group, and
wherein the ester group is represented by

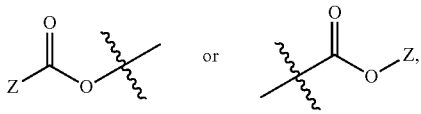

and Z is an alkyl group having 1 to 20 carbon atoms.
2. The copolymer of claim 1, wherein Chemical Formula 3 is Chemical Formula 3-1:

wherein,
n is an integer of 1 to 10,000.
3. The copolymer of claim 1, wherein the copolymer has a number average molecular weight of 500 g/mol to 1,000,000 g/mol.
4. The copolymer of claim 1, wherein the copolymer has molecular weight distribution of 1 to 100.
5. The copolymer of claim 1, wherein the copolymer has solubility of 10 mg/mL or higher for a toluene or xylene solvent.
6. An organic solar cell comprising:
a first electrode;
a second electrode provided opposite to the first electrode; and
one or more organic material layers provided between the first electrode and the second electrode, and comprising a photoactive layer,
wherein one or more layers of the organic material layers comprise the copolymer of claim 1.
7. The organic solar cell of claim 6, wherein the photoactive layer comprises one, two or more selected from the group consisting of an electron donor and an electron acceptor, and the electron donor comprises the copolymer.
8. The organic solar cell of claim 7, wherein the electron acceptor is selected from the group consisting of fullerene, fullerene derivatives, carbon nanotubes, carbon nanotube derivatives, bathocuproine, semiconducting elements, semiconducting compounds and combinations thereof.
9. The organic solar cell of claim 7, wherein the electron donor and the electron acceptor form a bulk heterojunction (BHJ).
10. The organic solar cell of claim 6, wherein the photoactive layer has a bilayer structure comprising an n-type organic material layer and a p-type organic material layer, and the p-type organic material layer comprises the copolymer.
11. The organic solar cell of claim 6, which has an inverted structure in which the first electrode is a cathode and the second electrode is an anode, the organic solar cell further comprising:
a cathode buffer layer provided between the photoactive layer and the first electrode; and

[Chemical Formula 3-1]

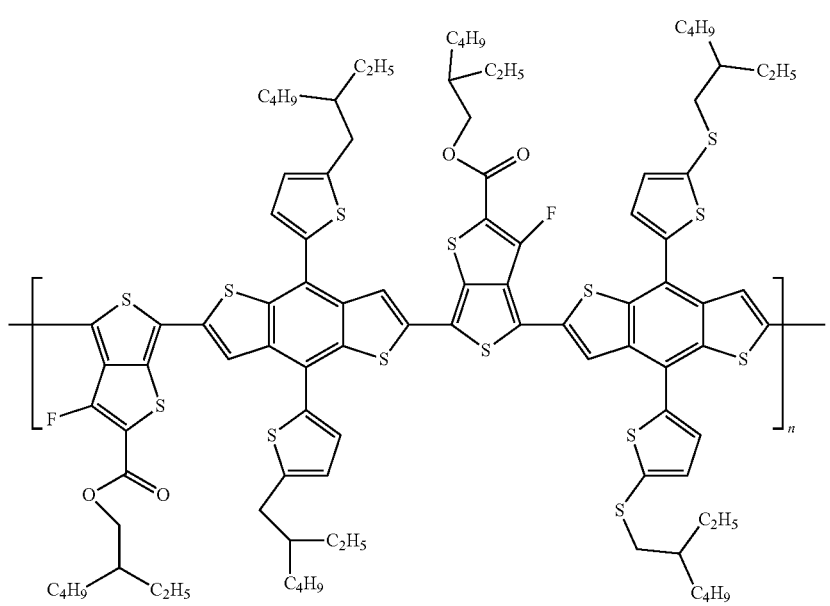

an organic material layer comprising a fullerene derivative between the photoactive layer and the cathode buffer layer.

12. The organic solar cell of claim 6, further comprising an anti-reflective film on a surface of the first electrode opposite to a surface provided with the photoactive layer.

13. A method for manufacturing an organic solar cell comprising:
   preparing a substrate;
   forming a first electrode on one region of the substrate;
   forming an organic material layer comprising a photoactive layer on a top of the first electrode; and
   forming a second electrode on the organic material layer,
   wherein the photoactive layer comprises the copolymer of claim 1.

14. The method for manufacturing the organic solar cell of claim 13, wherein the photoactive layer is formed using a solution comprising a non-halogen solvent and the copolymer.

15. The copolymer of claim 1, wherein A3 and A4 are each a branched alkyl group.

\* \* \* \* \*